(12) United States Patent
Li et al.

(10) Patent No.: US 8,809,121 B2
(45) Date of Patent: Aug. 19, 2014

(54) SINGULATION OF IC PACKAGES

(75) Inventors: Martin Ka Shing Li, Hong Kong (CN); Max Leung, Hong Kong (CN); Pompeo Umali, Hong Kong (CN)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 13/876,819

(22) PCT Filed: Sep. 29, 2010

(86) PCT No.: PCT/CN2010/001520
§ 371 (c)(1),
(2), (4) Date: Jun. 24, 2013

(87) PCT Pub. No.: WO2012/040873
PCT Pub. Date: Apr. 5, 2012

(65) Prior Publication Data
US 2013/0302945 A1 Nov. 14, 2013

(51) Int. Cl.
*H01L 21/00* (2006.01)
(52) U.S. Cl.
USPC .......................................... 438/113; 438/462
(58) Field of Classification Search
None
See application file for complete search history.

(56) References Cited

U.S. PATENT DOCUMENTS

| 4,997,793 | A | 3/1991 | McClurg |
| 6,872,599 | B1 | 3/2005 | Li et al. |
| 7,187,060 | B2 * | 3/2007 | Usui ............................ 257/659 |
| 7,585,750 | B2 | 9/2009 | Do et al. |
| 7,985,624 | B2 * | 7/2011 | Kaneda ......................... 438/114 |
| 2009/0140364 | A1 | 6/2009 | Ishihara |
| 2010/0068851 | A1 | 3/2010 | Jeung et al. |
| 2010/0308468 | A1 | 12/2010 | Yoshikawa et al. |
| 2012/0181678 | A1 * | 7/2012 | Groenhuis et al. ............ 257/676 |

FOREIGN PATENT DOCUMENTS

| CN | 1393939 A | 1/2003 |
| CN | 1835196 A | 9/2006 |
| CN | 101383296 A | 3/2009 |
| CN | 101477977 A | 7/2009 |
| CN | 101521164 A | 9/2009 |
| JP | 6-196557 A | 7/1994 |
| WO | 2009/007930 A2 | 1/2009 |
| WO | 2009/113267 A1 | 9/2009 |
| WO | 2009/125250 A1 | 10/2009 |

OTHER PUBLICATIONS

International Search Report for application No. PCT/CN2010/001520 (Jul. 14, 2011).

* cited by examiner

*Primary Examiner* — Whitney T Moore
*Assistant Examiner* — Joseph Galvin, III

(57) ABSTRACT

A method of dividing a two dimensional array of encapsulated integrated circuits into individual integrated circuit packages uses a first series of parallel cuts (32) extending fully through the leadframe (16) and encapsulation layer (14), and defining rows of the array. The cuts terminate before the beginning and end of the rows such that the integrity of the array is maintained by edge portions (34) at the ends of the rows. After plating contact pads (18), a second series of parallel cuts (36) is made extending fully through the leadframe (16) and encapsulation layer (14). This separates the array into columns thereby providing singulation of packages between the edge portions (34).

7 Claims, 5 Drawing Sheets

SINGULATION OF IC PACKAGES

The invention relates to the singulation of electronic IC packages.

IC packaging is one of the final stages involved in the fabrication of IC devices.

During IC packaging, one or more IC chips are mounted on a package substrate, connected to electrical contacts, and then coated with an encapsulation material comprising an electrical insulator such as epoxy or silicone molding compound. The resulting IC package can then be mounted onto a printed circuit board (PCB) and/or connected to other electrical components.

In most IC packages, the IC chip is completely covered by the encapsulation material, while the electrical contacts are at least partially exposed so that they can be connected to other electrical components. A metal leadframe is commonly used to form part of the IC package, and defines the external electrical contacts.

The electrical contacts can for example form leads extending out from the sides of the encapsulating material. The leads typically are bent downward to form connections with electrical components on a PCB. However, these leads tend to significantly increase the size of IC packages.

IC packages are also known in which the external leads are replaced by electrical contacts that are covered on top by the encapsulating material but exposed on the bottom of the IC package so they can be connected to electrical components located beneath the IC package. These IC packages, referred to as "leadless" IC packages, tend to occupy less space compared with conventional IC packages due to the absence of the external leads. In addition, these IC packages eliminate the need to bend the leads to form connections.

Currently most semiconductor leadless plastic packages have a non-exposed lead end, sometimes termed a "pullback" lead terminal. Some end customers or users do not prefer to use this package type due to non-visibility of the solder joint after mounting on a PCB. Particularly, medical, military and automotive applications require all solder joints to be visible under low power microscope inspection, which is difficult for pullback terminals. Thus, planar terminals are often preferred (sometimes termed "no pullback" terminals).

This invention relates specifically to the singulation of individual packages after the packaging process has been applied to an array of devices. It can be applied to different package types, but is of particular interest for leadless packages.

In order to divide individual packaged chips from a 2D array, a set of row cuts and column cuts are required. Plating of the leadframe contacts is required after a cut, so that an exposed cut edge is also plated.

A known process involves cutting the input/output (I/O) leads up to the encapsulation material surface, but not sawing through the encapsulation material. Connecting tie bars within the encapsulation material remain intact, and these serve as an electrical path for tin electroplating to allow to plating of the I/O lead ends. This partial cut exposes side walls of the leadframe contact pad, before the plating.

However, since the sawing is not through the complete structure, a second cutting step is required after plating. To avoid damaging the plated surface during final package singulation, it is required to use a thinner sawing blade for the second sawing operation. This second sawing operation is in the same locations as the partial cuts, and is followed by the cuts in the orthogonal direction.

A problem with this approach is that the cuts in one direction are carried out as a two-sage process, requiring three cutting operations in total. Also, accurate alignment between the two stages of the two-stage cutting process is required. The final product also has a stepped outer profile resulting from the two-stage cutting process with different size saw blades.

According to the invention, there is provided a method of dividing a two dimensional array of encapsulated integrated circuits into individual integrated circuit packages, wherein the array comprises a leadframe and an encapsulation layer over the leadframe in which the integrated circuits are encapsulated, wherein the method comprises:

performing a first series of parallel cuts, the cuts extending fully through the leadframe and encapsulation layer, and defining rows of the array, wherein the cuts terminate before the beginning and end the rows such that the integrity of the array is maintained by edge portions at the ends of the rows;

plating contact pads of the leadframe, and including contact pad edge regions formed by the first series of cuts; and performing a second series of parallel cuts, angled with respect to the first series of parallel cuts, the cuts extending fully through the leadframe and encapsulation layer, and separating the array into columns thereby providing singulation of packages between the edge portions.

This method requires only two cutting operations, each of which cuts fully through the leadframe and encapsulation. Integrity of the structure is maintained after the first set of cuts by ensuring they do not extend fully across the structure. Instead, end edge regions are left intact. This provides the required rigidity for the plating process despite the cuts extending fully through the substrate.

The leadframe preferably comprises contact pads at the underside of the leadframe, opposite the encapsulation layer. This defines a leadless package. The plating preferably comprises tin.

The leadframe and encapsulation layer can be provided over a tape, and the method then comprises removal of the singulated packages from the tape.

After the first series of parallel cuts, the leadframe preferably provides electrical interconnection between all contact pads in each row and provides electrical interconnection between the contact pads of different rows by means of the edge portions. This enables the contact pads to act as a single electrode for electroplating.

Each package can comprise exactly one or two contact pads at one edge and exactly one or two contact pads at an opposite edge. This enables a simple design of leadframe to provide the desired interconnections between contact pads after the first set of cuts. This is most easily achieved if each package comprises exactly two or three contact pads.

An example of the invention will now be described in detail with reference to the accompanying drawings, in which.

The invention provides a package singulation method in which two series of full depth cuts are used, with one series angled with respect to the other to define a grid (for example orthogonal cuts). The first series does not extend the full span of the complete package, so that integrity of the structure is maintained between the two series of cuts.

Figure 1:
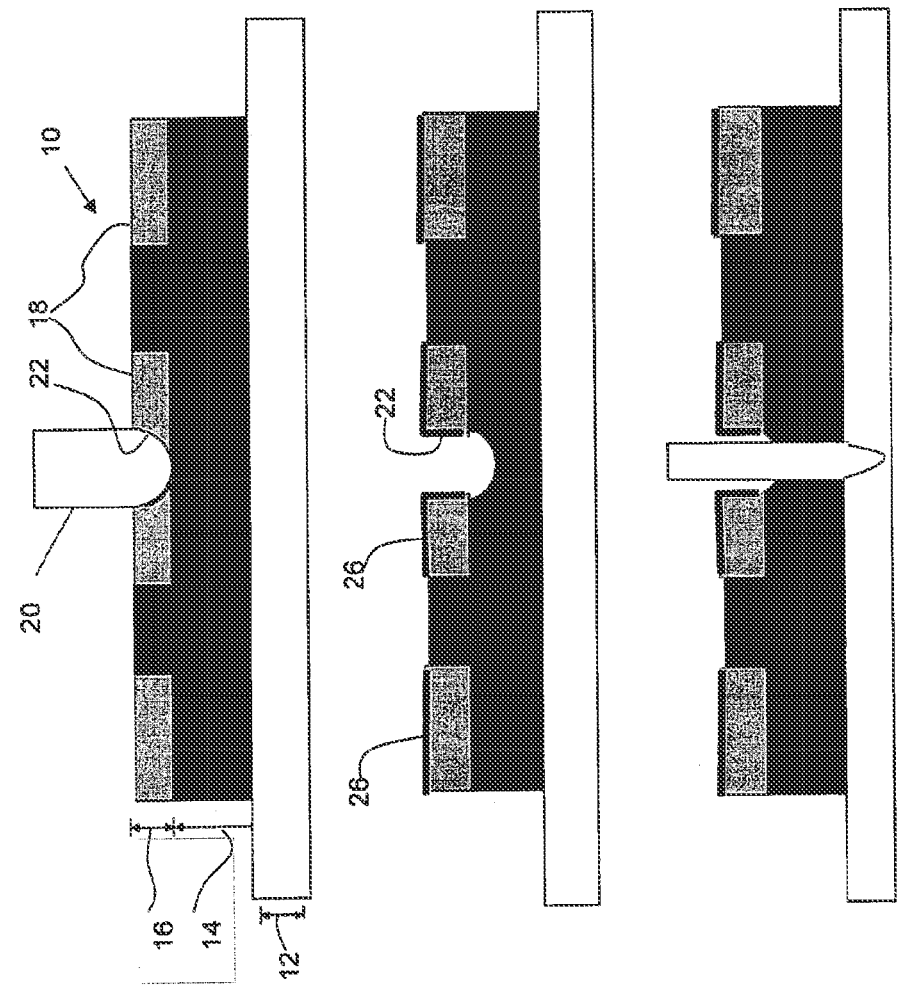
FIG. 1 shows a known singulation method for an array of leadless packages.
Figure 1:
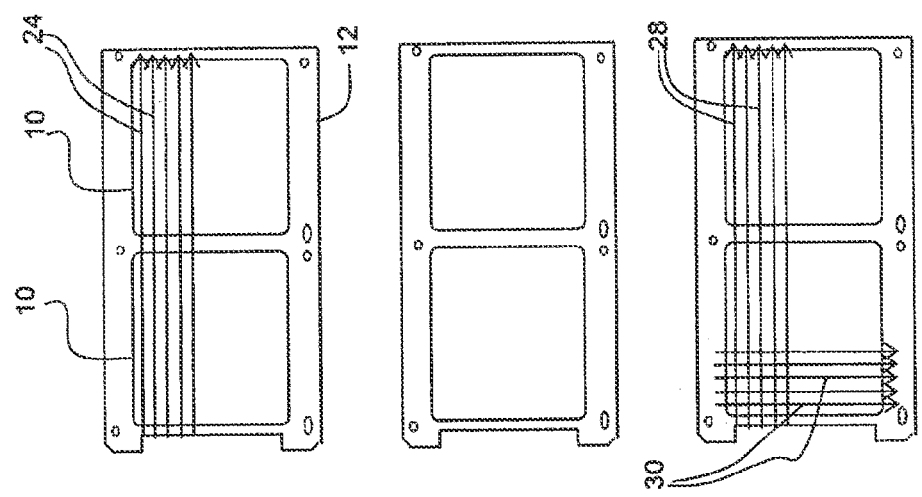

FIG. 1 shows a known singulation method for an array of leadless packages.

By way of example, two complete package structures 10 are shown over a tape 12. Each package structure has an array of integrated circuits embedded in an encapsulation layer 14. These circuits connect to a leadframe 16 in conventional manner.

The leadframe 16 has contact pads 18 which are at the bottom surface of each package, for connecting the package to a PCB or other component. The cross sections in FIG. 1 (and FIG. 2) represent the packages upside down, since the sawing operations take place from the underside of the packages.

In order to divide individual packaged chips from the 2D array 10, a set of row cuts and column cuts are required. However, plating of the leadframe contacts 18 is required after a cut, so that an exposed cut edge is also plated.

A soldered lead end (as well as downward facing contact face) is desired to ensure that the solder wetting quality is clearly visible from all angles by the naked eye or by optical inspection.

The first step of the known process is to provide a partial cut, using a sawing blade 20, to expose side walls 22 of the leadframe contact pad 18. This is shown in the top part of FIG. 1. The partial cut comprises a series of parallel cuts 24 defining a set of rows of packaged ICs, but these have not yet been separated, because the partial cut does not extend fully through the encapsulation layer, as can be seen in the middle cross section in FIG. 1.

The middle part of FIG. 1 shows a deflashing and plating operation, for example tin plating 26. This plates the base areas of the contact pads 18 as well as the side walls 22.

Two sets of further full depth cuts are needed. A first set 28 completes the partial cuts and a second set 30 is orthogonal to divide the structure 10 into a grid. The first set 28 uses a thinner saw blade to prevent damage to the plated edge area.

The bottom cross section in FIG. 1 shows the partial cut being completed. Because the blade is narrower than the first blade, the edge of the package has a stepped edge profile, with the edge of the contact in a recess.

This process requires accurate alignment between the two stages of the cut.

Figure 2:
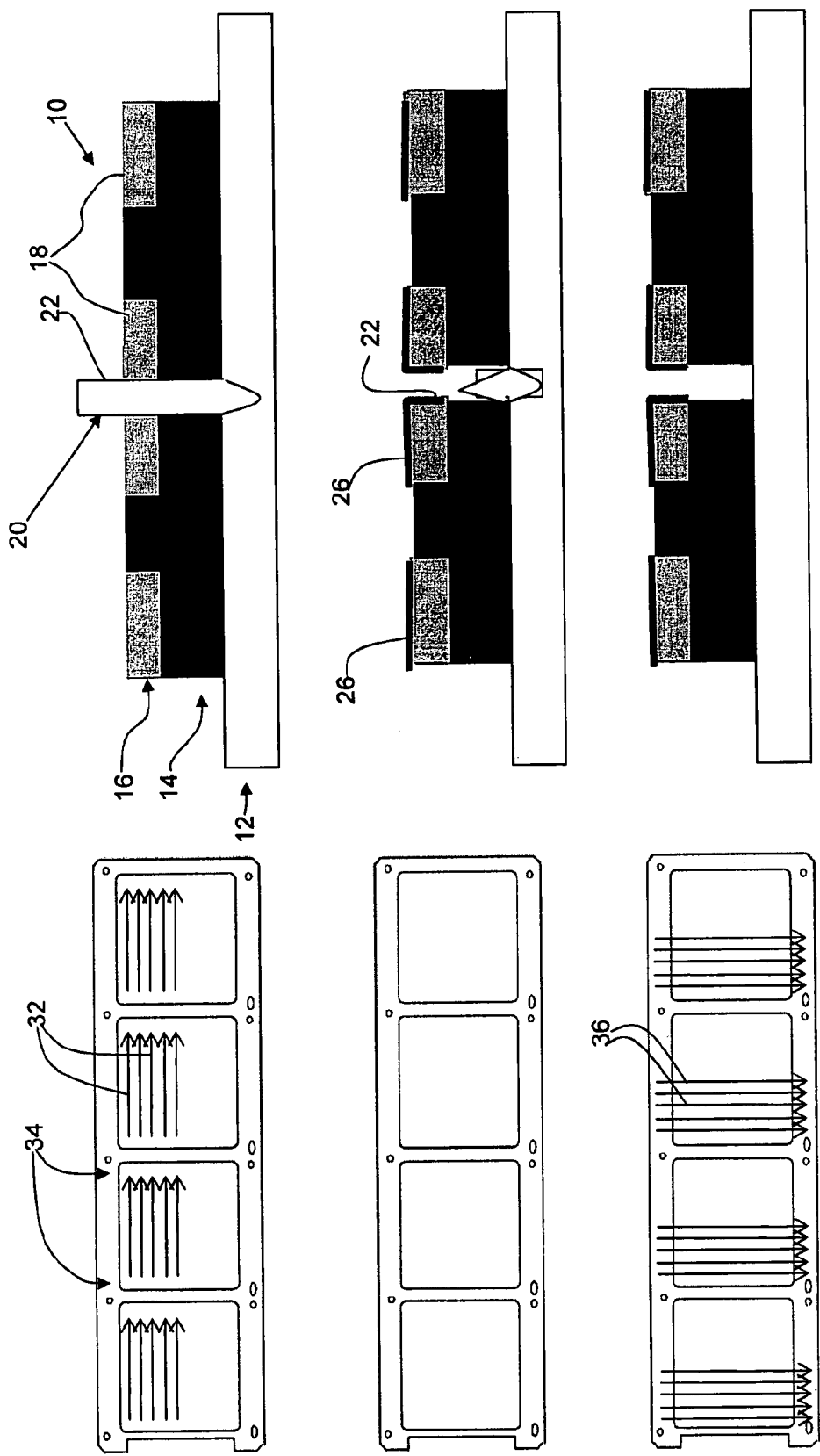
FIG. 2 shows an example of singulation method of the invention, again for an array of leadless packages.

FIG. 2 shows an example of singulation method of the invention, again for an array of leadless packages. The same reference numerals are used to denote the same components.

In this example, four complete package structures 10 are shown over the tape 12. Each package structure again has an array of integrated circuits embedded in an encapsulation layer 14. These circuits connect to a leadframe 16 in conventional manner.

The first step of the new process is to provide a full depth cut, using a sawing blade 20, to expose side walls 22 of the leadframe contact pad 18. This is shown in the top part of FIG. 2. The full depth cut 32 extends through the leadframe and the encapsulation, but it does not extend fully across the package structures 10. Instead, the cuts terminate before the beginning and end of the rows such that the integrity of the array is maintained by edge portions at the ends of the rows. These edge portions 34 can comprise the first and last device areas in the row.

Thus, the opposite end portions of the rows will not be used to form devices, and can simply comprise additional dummy areas.

The middle part of FIG. 2 shows the same deflashing and plating operation, providing tin plating 26. This plates the base areas of the contact pads 18 as well as the side walls 22.

Only one further set of full depth cuts is needed. This set of cuts 36 is orthogonal to the first set and divides the structure 10 into a grid.

The process can be implemented using existing packaging platforms with very minimal added cost impact and zero capital expenditure.

The process can be used for multiple I/O terminal configurations. The terminals need to be electrically connected to each other after the first cut, so that they together define a plating electrode. In the case of 2 I/O terminals, one on each side of the package, tie bars connect all terminals together even after the first cut, and the terminals are only isolated from each other after the second cut. For example, assuming the first cut divides the array into rows, the terminals along the rows are connected by tie bars, and the terminals of the different rows are connected together at the row ends, where the first cut has not been made. This approach can be used when there are two terminals on one side and one terminal on the other side—again all three terminals can be connected together by column-direction tie bars.

In the process of the invention, the cut edge of the leadframe terminal is fully covered with tin material after full singulation.

The process of the invention thus provides good quality terminals and enables only two sawing operations to be carried out. After the first set of cuts, by maintaining the structural integrity, the structure is suitable for handling by an automatic feeder for the (optional) deflashing and plating process.

The unused space required to form the edge regions typically results in around 4% less devices per leadframe.

As mentioned above, the plating process requires all terminals to be connected together electrically to form a plating electrode.

Figure 3:
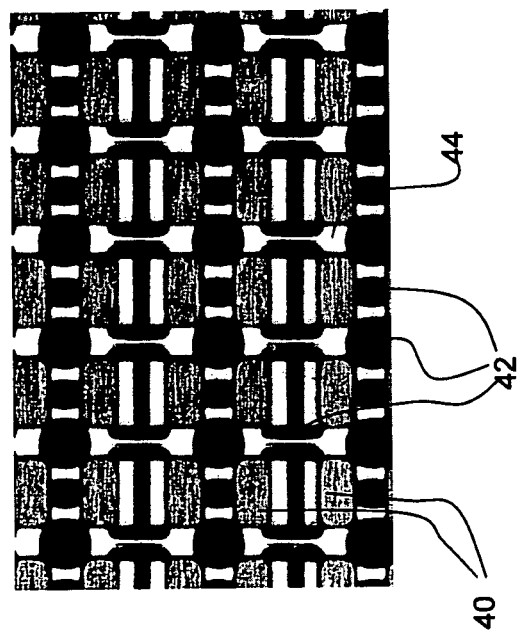
FIG. 3 shows an example of leadframe suitable for use in the method of the invention.
Figure 3:
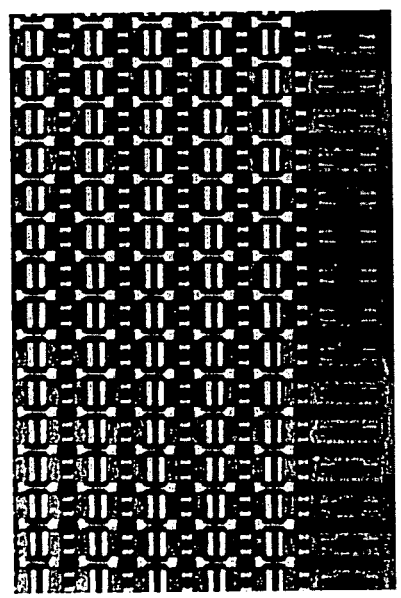

FIG. 3 shows one example of design of the leadframe in more detail. The right image is an enlarged portion of the left image.

The grey areas 40 are the contact terminals, which extend to the surface of the structure. Within the structure are tie bars defined by the white areas 44. These areas 44 are embedded in the encapsulation material. The black areas 42 are openings in the pattern of the leadframe. In this example, each package has two terminals 40, one at the top and one at the bottom. The two terminals are connected together by tie bars 44 in the column direction.

Figure 4:
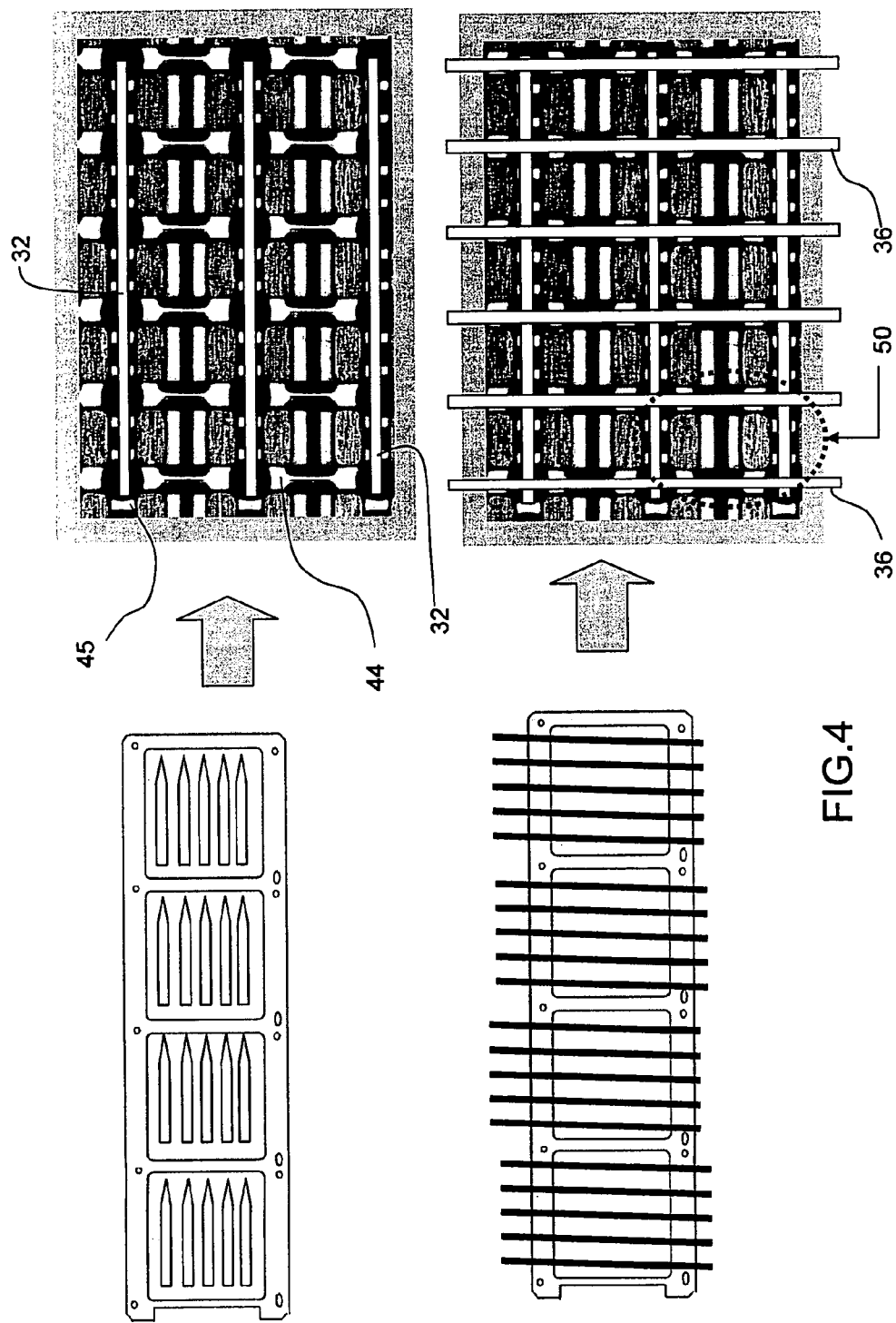
FIG. 4 is used to explain how the leadframe of FIG. 3 provides the desired electrical connections.

FIG. 4 is used to explain how the leadframe of FIG. 3 provides the desired electrical connections.

The top part of FIG. 4 shows the first set of cuts 32 in the row direction. This set of cuts isolates the rows of packages. However, within each row, the two terminals of each package are connected together by the vertical tie bar portions 44, and all terminals in the row are also connected together because these vertical tie bar portions 44 extend in the row direction (i.e. their width) between adjacent terminals. The edge portions at each end of the cuts provide connections between all rows (particularly the tie bar portions 45) so that all terminals are electrically connected together and function as a plating electrode.

Figure 5:
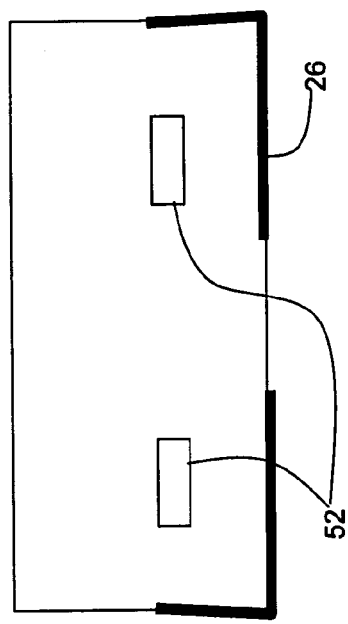
FIG. 5 shows one singulated package in side view.

The second set of cuts 36 is shown in the lower part of FIG. 4. A single packaged device is shown as 50. The sides of the package have cut tie bar portions 52 as shown in FIG. 5. As also shown, there is no step in the profile of the end wall.

The reference to rows and columns is somewhat arbitrary, and these terms should simply be understood as used to denote angled (ideally near orthogonal) lines, so that they together define a grid. Thus, "row" and "column" do not have any special meaning in relation to the package contents or connection terminals.

The structure of the leadframe and encapsulation, as well as the plating process and material, and the optional deflashing process has not been described in detail, since these aspects are entirely conventional and do not need to be modified in order to implement the singulation method of the invention.

In brief, the leadframe comprises is formed using a strip to strip plating process.

The structure typically comprises the leadframe, chips and gold connection wires, with the wires embedded in the molding compound. The leadframe and wirebonded units are encapsulated using a transfer molding process.

The tin plating process is an electrolytic process in strip format.

The sawing operation uses a saw blade in the form of a diamond saw blade.

The tape is used to hold multiple packages together.

The invention can be applied to plastic or ceramic leadless packages.

Various modifications will be apparent to those skilled in the art.

The invention claimed is:

1. A method of dividing a two dimensional array of encapsulated integrated circuits into individual integrated circuit packages, wherein the array comprises a leadframe and an encapsulation layer over the leadframe in which the integrated circuits are encapsulated, wherein the method comprises:

performing a first series of parallel cuts, the cuts extending fully through the leadframe and encapsulation layer, and defining rows of the array, wherein the cuts terminate before the beginning and end of the rows such that the integrity of the array is maintained by edge portions at the ends of the rows;

plating contact pads of the leadframe, and including contact pad edge regions formed by the first series of cuts; and performing a second series of parallel cuts, angled with respect to the first series of parallel cuts, the cuts extending fully through the leadframe and encapsulation layer, and separating the array into columns thereby providing singulation of packages between the edge portions.

2. A method as claimed in claim 1, wherein the leadframe comprises contact pads at the underside of the leadframe, opposite the encapsulation layer.

3. A method as claimed in claim 1, wherein the plating comprises tin.

4. A method as claimed in claim 1, wherein the leadframe and encapsulation layer are provided over a tape, and the method comprises removal of the singulated packages from the tape.

5. A method as claimed in claim 1, wherein after the first series of parallel cuts, the leadframe provides electrical interconnection between all contact pads in each row and provides electrical interconnection between the contact pads of different rows by means of the edge portions.

6. A method as claimed in claim 1, wherein each package comprises exactly one or two contact pads at one edge and exactly one or two contact pads at an opposite edge.

7. A method as claimed in claim 6, wherein each package comprises exactly two or three contact pads.

* * * * *